United States Patent
Hardial et al.

(10) Patent No.: US 7,239,215 B2
(45) Date of Patent: Jul. 3, 2007

(54) MULTICELL AMPLIFIER AND POWER DIVIDER/COMBINER EMPLOYABLE IN SAME

(75) Inventors: Gill Hardial, Backnang (DE); Stefan Koch, Oppenweiler (DE)

(73) Assignee: Marconi Communications GmbH, Backnang (DE)

( * ) Notice: Subject to any disclaimer, the term of this patent is extended or adjusted under 35 U.S.C. 154(b) by 0 days.

(21) Appl. No.: 10/482,795

(22) PCT Filed: Jul. 6, 2002

(86) PCT No.: PCT/IB02/02926

§ 371 (c)(1),
(2), (4) Date: Jul. 16, 2004

(87) PCT Pub. No.: WO03/005573

PCT Pub. Date: Jan. 16, 2003

(65) Prior Publication Data

US 2004/0246055 A1    Dec. 9, 2004

(30) Foreign Application Priority Data

Jul. 6, 2001    (EP) ................................ 01116449

(51) Int. Cl.
*H01P 5/12*    (2006.01)

(52) U.S. Cl. ........................ 333/125; 333/100; 333/136
(58) Field of Classification Search ................ 330/295, 330/124 R; 333/100, 132, 136, 124–129
See application file for complete search history.

(56) References Cited

U.S. PATENT DOCUMENTS

| | | | | |
|---|---|---|---|---|
| 3,928,806 | A * | 12/1975 | Carter et al. ................. | 455/129 |
| 4,547,745 | A * | 10/1985 | Freitag et al. ............... | 330/286 |
| 5,430,418 | A * | 7/1995 | Blodgett ...................... | 333/100 |
| 5,767,755 | A * | 6/1998 | Kim et al. ................... | 333/101 |
| 6,388,528 | B1 * | 5/2002 | Buer et al. ................... | 330/295 |
| 6,472,950 | B1 * | 10/2002 | London ....................... | 333/125 |

* cited by examiner

*Primary Examiner*—Robert Pascal
*Assistant Examiner*—Kimberly E Glenn
(74) *Attorney, Agent, or Firm*—Kirschstein et al.

(57) ABSTRACT

A multicell amplifier comprises a first divider unit, which receives the input signal of the amplifier, divides it into 2N subsignals, amplifies them and recombines the amplified signals in two N-way combiners to form two local output signals; two further divider units which take the local output signals and divide them into 4N subsignals, amplify them and recombine the amplified signals to form three local output signals; and two combiner units which take the three local output signals and divide them into 4N subsignals, amplify them and recombine the amplified signals to provide the output signal of the amplifier.

10 Claims, 7 Drawing Sheets

MULTICELL AMPLIFIER AND POWER DIVIDER/COMBINER EMPLOYABLE IN SAME

Multistage power amplifiers designed in MMIC technology have been known since the introduction of GaAs semiconductor technology. To achieve the desired gain, the amplifier stages are usually cascaded (i.e. series-configured) or, to achieve power addition, amplifying devices may be connected in parallel. An example of a parallel-configured amplifier is shown in FIG. 1(a), in which a cell of 2 FETs is connected to a larger cell of 5 FETs to form a 2-stage amplifier. The input power is divided to feed the FETs 11, the outputs of the FETs are combined, then divided again to feed the second-stage FETs 12, the outputs of the latter being combined to form the output of the amplifier.

One problem with this scheme is the differential path lengths taken by the input signal, in particular in connection with the second stage. Thus the outer FETs 12 see a delayed input signal 13 compared with the inner FET or FETs, which impairs the performance of the amplifier.

One way of compensating for this has been to split the input feed into subgroups, as shown in FIG. 1(b). While this addresses at least to some extent the problem of differential phase delays between the FET feeds, the fact that now the lengths of the tacks feeding the FETs approaches the wavelength of operation of the FETs means that spurious resonance effects can occur, which again impair the amplifier performance by creating inefficiencies in the combining action of the combiner elements. In addition, the spurious resonances makes the amplifier unstable.

Another drawback of the types of parallel arrangement shown in FIGS. 1(a) and (b) is the limitation in the number of FETs that can be connected in parallel. This is due to the fact that, whereas the transconductance of the amplifier as a whole is increased in proportion to the number of FETs parallelled, this being the desired effect, there is a concomitant decrease in the gain-bandwidth product of the amplifier, due to the increase in parasitic input and output capacitances.

In an attempt to reduce the deterioration in gain-bandwidth product the distributed-amplifier configuration ("travelling-wave amplifier") of FIG. 2 has been employed. In this arrangement a series of FETs 30 are fed from tappings along a gate transmission line 31, which tappings are separated by sections of transmission line 32, and the outputs from the drains of the FETs are connected to a drain transmission line 33 at respective tappings separated by further sections of transmission line 34. The output of the amplifier is taken from the end 35 of the line 33. The sections of transmission line 32 are loaded uniformly with $C_{GS}$ of the transistor having a particular phase constant. The sections of transmission line 33 are selected to have the same specific phase constant when uniformly loaded with $C_{DS}$ of the transistor. The transmission lines 31 and 32 are terminated with 50 ohms (36) to avoid standing waves.

The distributed amplifier scheme overcomes the difficulty of reduced gain-bandwidth product inherent in the earlier described parallel arrangements in that it adds the individual $g_m$'s of the FETs without adding their input and output capacitances. The scheme has its disadvantages, however, which include the following:

(a) The RF voltage decays along the gate line 31, so that the various FETs are not driven at the same RF voltage level. The first FET will reach saturation first, whereas the last FET may be operating in its linear region.

(b) The output network from the first FET has the maximum attenuation, with the result that the maximum output power is reduced significantly.

(c) The output power of a FET depends upon the load matching at the output port. In the design of distributed amplifiers (see, for example, Y. Ayasli et al, Palmer et al, "A Monolithic GaAs 1–13 GHz Traveling-Wave Amplifier", IEEE Trans. Microwave Theory Technology, Vol. MTT-30, pp. 976–981, July 1982) phase conditions are only taken into account with the aim of achieving maximum gain; the matching of the load to the amplifier is neglected.

A description of some known power-dividing and combining techniques in relation to MMIC technology is contained in "Power Splitting and Combining Techniques on MMICs", S. P. March, The GEC Journal of Technology, vol. 15, No. 1, 1998.

In accordance with the invention there is provided a multicell amplifier as described in claim 1. Advantageous realisations of the invention are contained in the subclaims.

Embodiments of the invention will now be described, by way of example only, with reference to the drawings, of which:

FIGS. 1(a) and (b) are schematic diagrams of known parallel FET amplifier arrangements;

Figure 3:
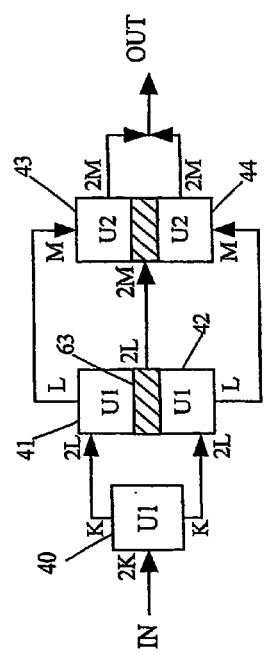
FIG. 3 is a schematic diagram of a multicell amplifier in accordance with the invention.
Figure 4A:
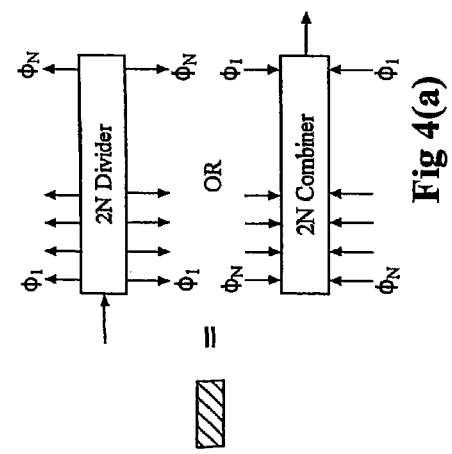
Figure 5:
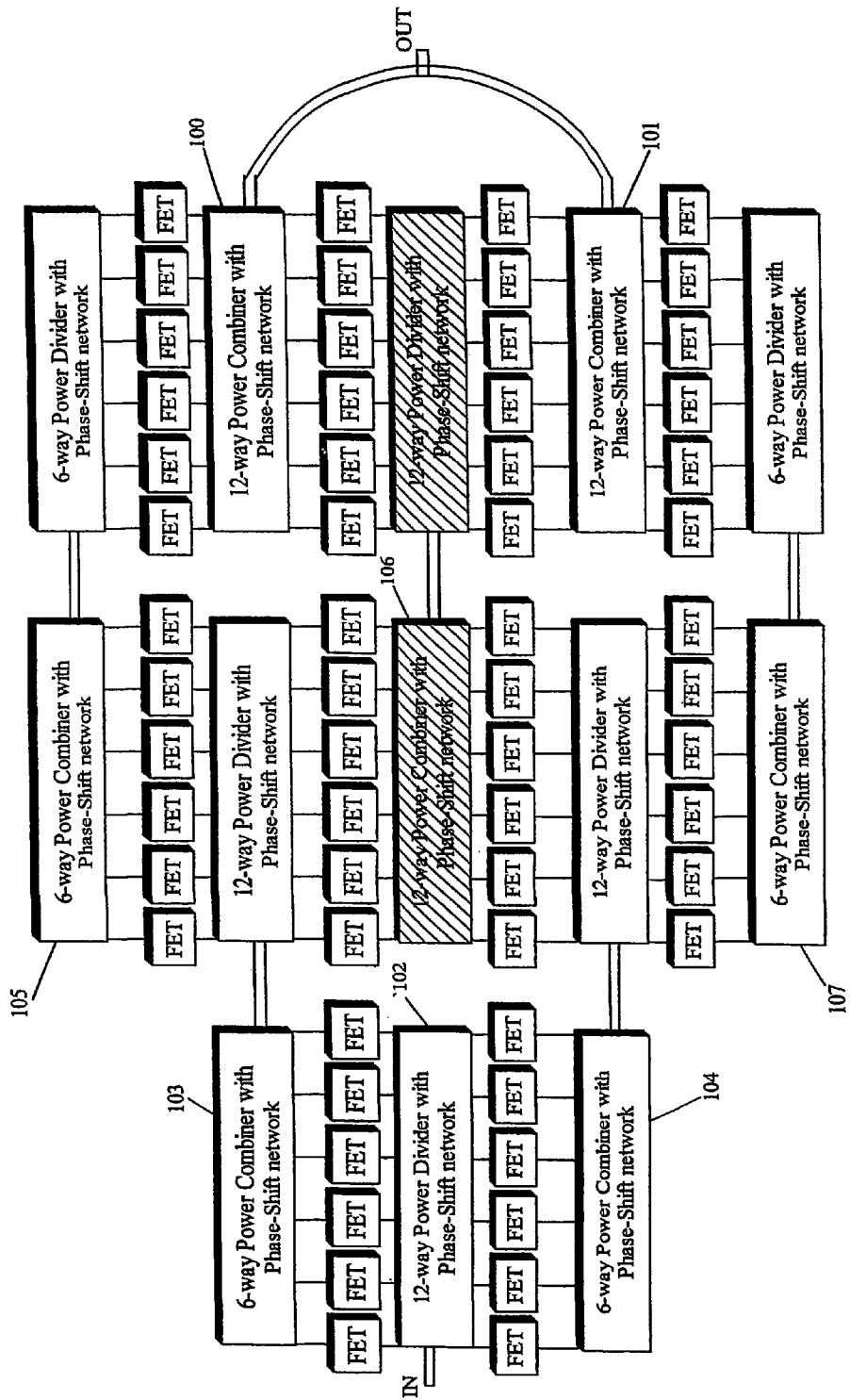

FIGS. 4(a), (b) and (c) are diagrams showing in greater detail the composition of three items shown in FIG. 3;

FIG. 5 is a diagram showing in expanded form the embodiment of the invention illustrated in FIG. 3.

Figure 6:
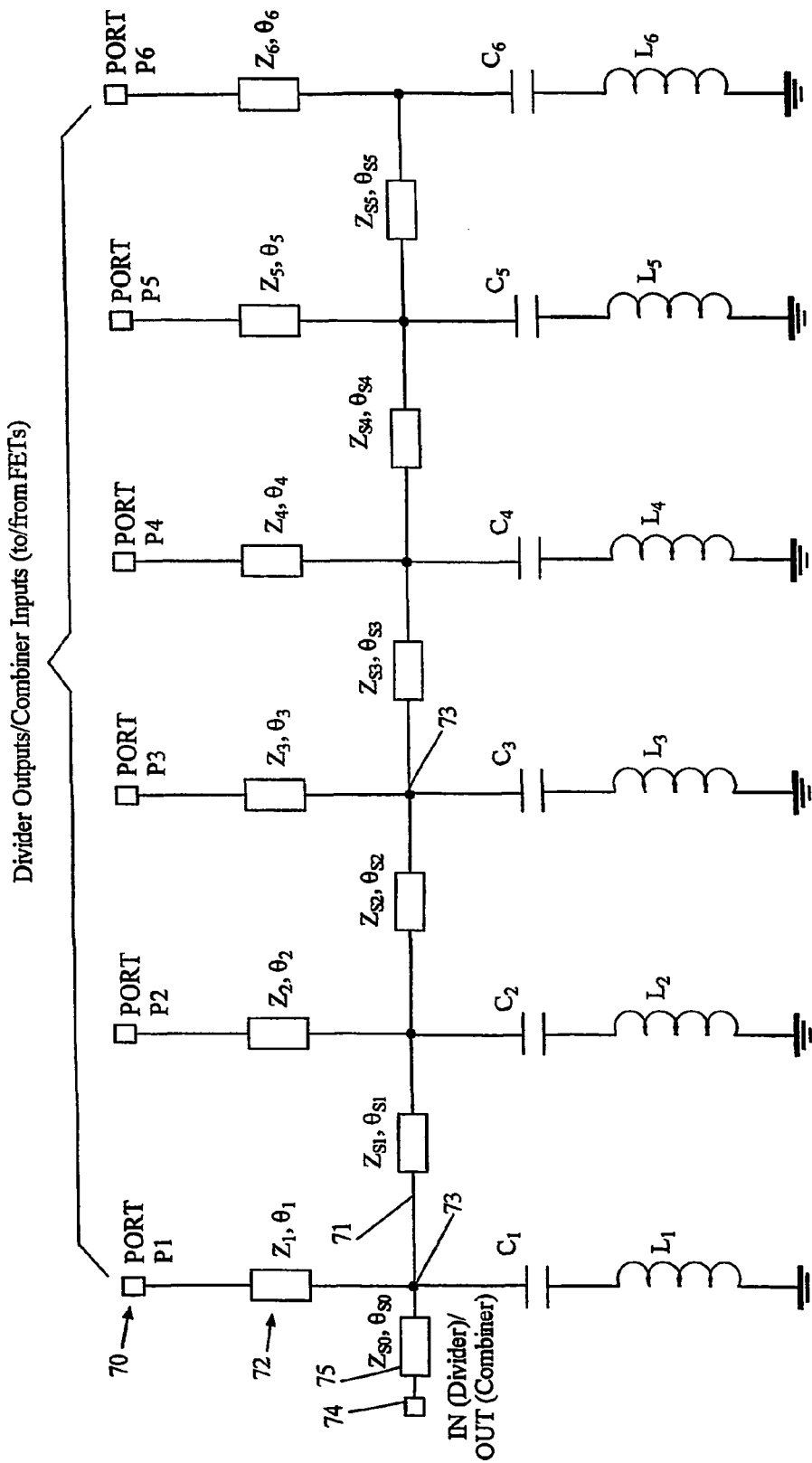
Figure 7:
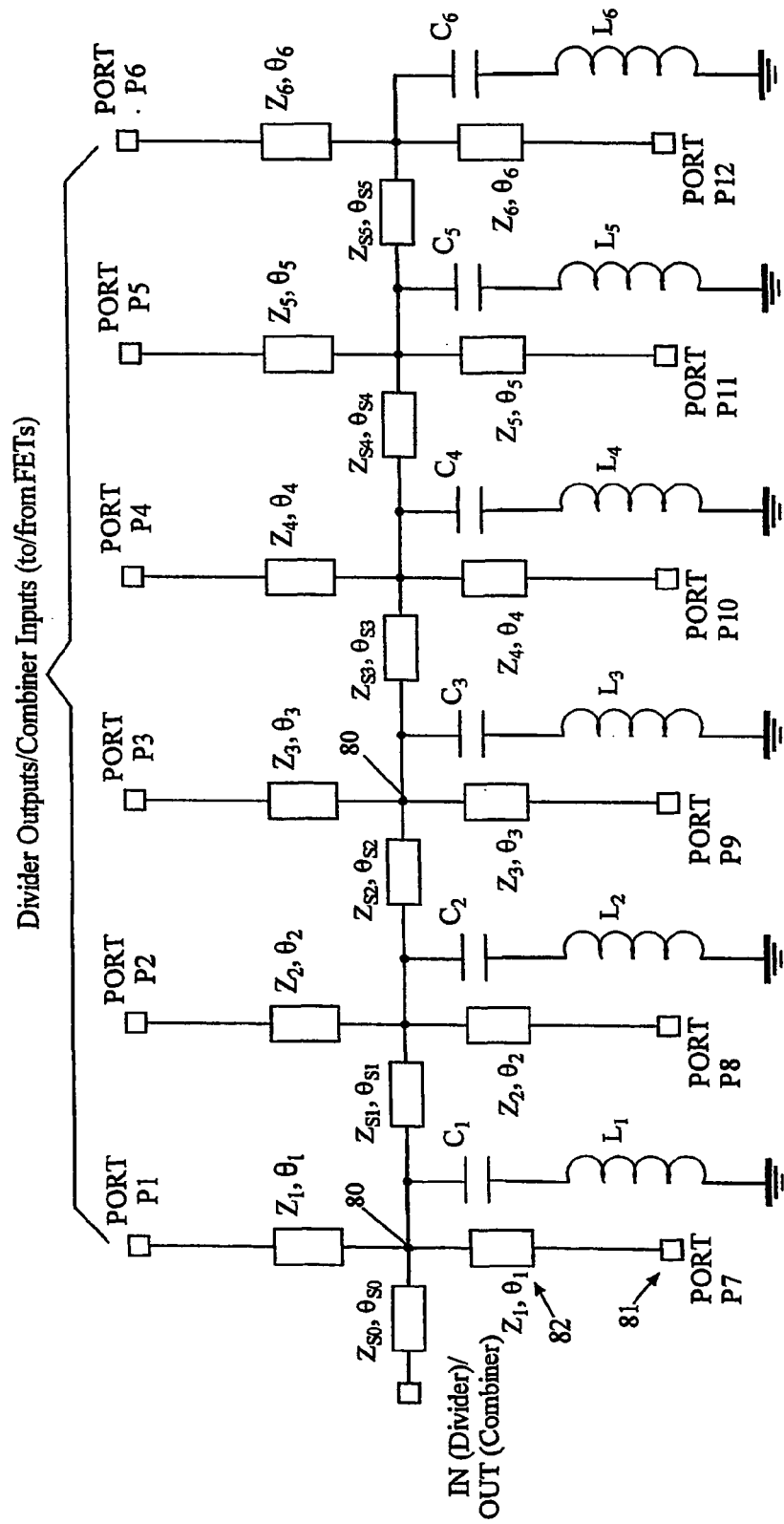
Figure 8:
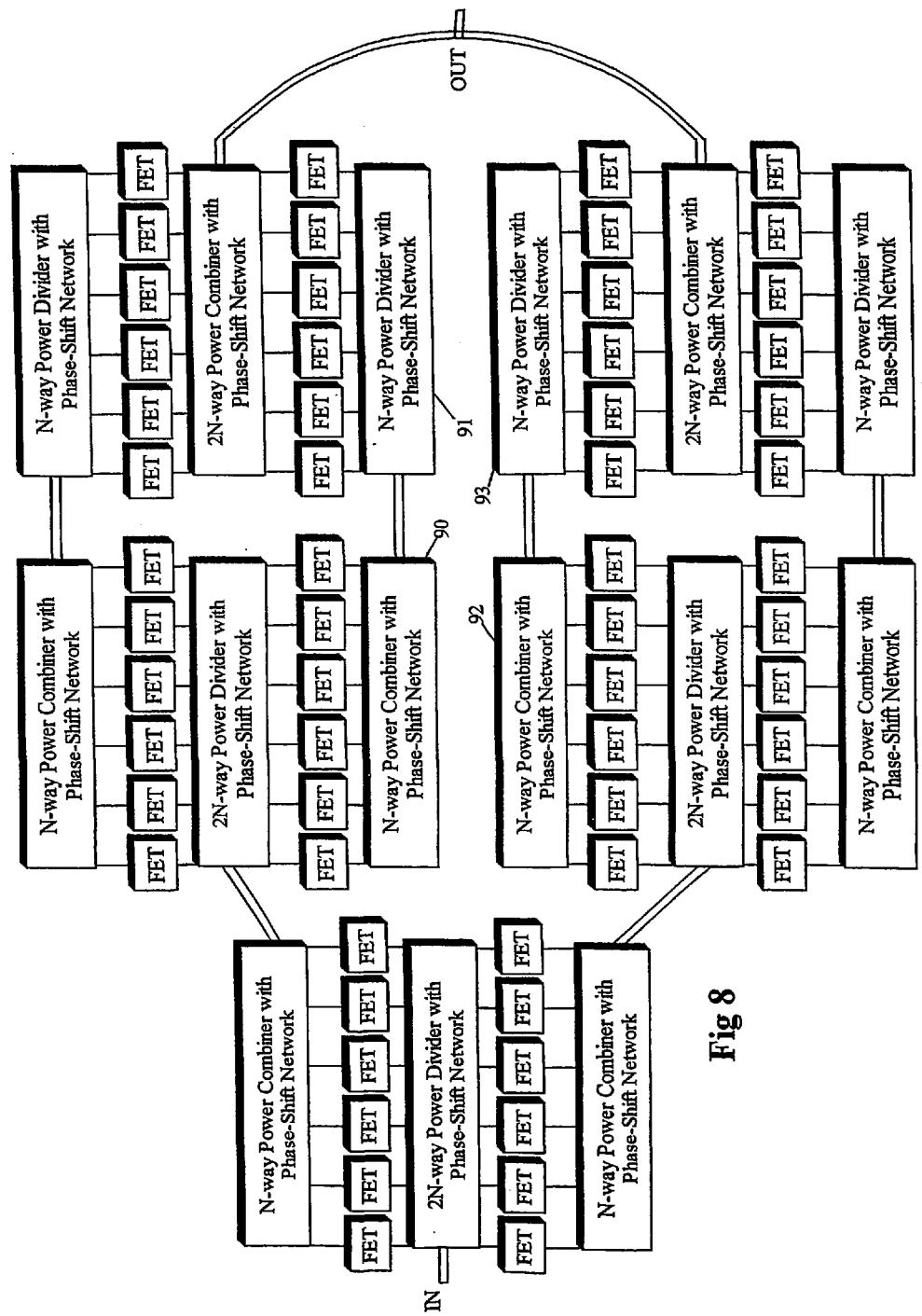
Figure 9:
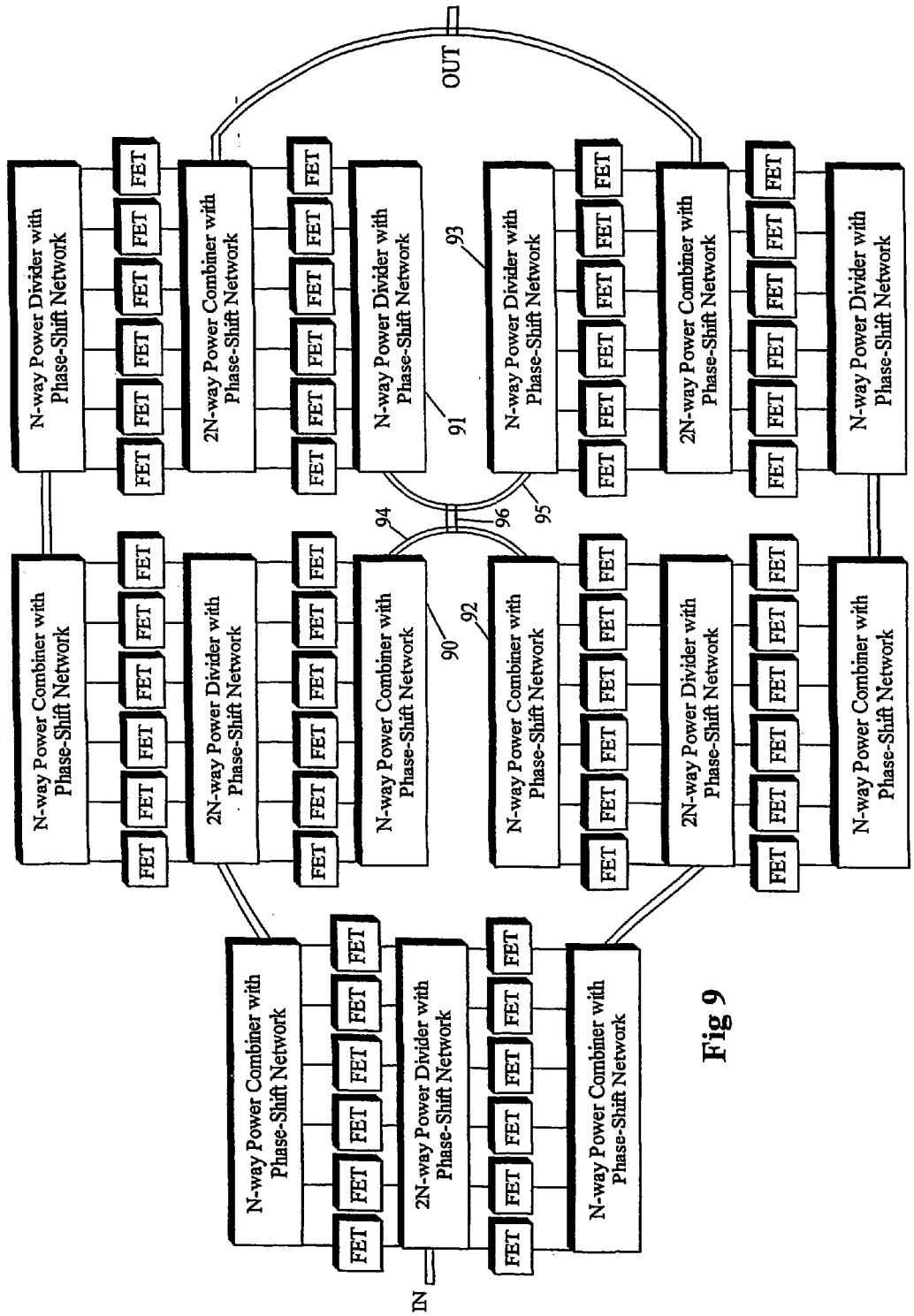

FIG. 6 is a circuit diagram of a 6-way divider/combiner forming part of the illustrated embodiment of the invention;

FIG. 7 is a circuit diagram of a 12-way divider/combiner forming part of the illustrated embodiment of the invention;

FIGS. 8 and 9 show two alternative realisations of a multicell amplifier according to the invention.

Referring now to FIG. 3, a multicell amplifier according to the invention comprises three divider units 40, 41, 42 and two combiner units 43, 44. The divider units take the form shown in FIG. 4(a) and comprise a 2N-way equal-power divider 50 with phase-shifts $\phi_1 \ldots \phi_N$, a set of 2N FETs 51, 52 and two N-way equal-power combiners 53, 54 with phase-shifts $\phi_1 \ldots \phi_N$. In use, the input signal is power-divided in the divider 50 to provide a set of N equal-amplitude, $\phi_1 \ldots \phi_N$ phase-shifted outputs to the FETs 51 and a further set of N equal-amplitude $\phi_1 \ldots \phi_N$ phase-shifted outputs to the FETs 52. The FETs are operated in common-source mode, so that the divider inputs are connected to the FET gates, the sources being grounded. The drains of the FETs are taken to the combiners 53, 54, to provide two output signals 55, 56.

The combiner units are similar, but comprise just one combiner 57 (with 2N inputs) and two N-way dividers 58, 59. In this case, two input signals enter the unit at the dividers 58, 59, the dividers then producing two sets of N output signals feeding the gates of respective FET cells 60, 61. The outputs (drains) of the FETs are taken to the inputs of the combiner 57, these outputs being as a result combined into one output signal 62.

In the preferred embodiment illustrated in FIG. 3, the two divider units (U1) are merged together, in that the combiner 54 of unit 41 and the combiner 53 of the unit 42 are realised as one unit. This merge, shown as the hatched area 63 in FIG. 3, takes the form of the 2N combiner shown in FIG. 4(a). Similarly, the two combiner units 43, 44 are merged together, as shown in FIG. 3, so that their respective dividers 59 (unit 43) and 58 (unit 44) are likewise realised as one unit to form the 2N divider illustrated in FIG. 4(a). This preferred arrangement is illustrated in FIG. 5, which portrays a scheme in which there are equal numbers of FETs in each cell, this number being in this case 6 (N=6).

A 6-way divider/combiner suitable for use in the FIG. 5 scheme is shown in FIG. 6. Here each port 70 is coupled to a loaded transmission line 71 through a transmission line 72, whose impedance and length parameters are variable ($Z_N$, $\theta_N$), the tapping points 73 on the line 71 being each taken to ground via an LC series combination, L and C being likewise variable ($L_1 \ldots L_N$, $C_1 \ldots C_N$). The series transmission line 71 has sections $Z_{S1}$, $\theta_{S1} \ldots Z_{SN}$, $\theta_{SN}$. Where the device is a 6-way divider, the input signal comes in at terminal 74 through transmission line 75 and the six outputs appear at the ports 70, where they link with the gates of the relevant FETs. The parameters $Z_N$, $\theta_N$, $L_N$, $C_N$ and $Z_{SN}$, $\theta_{SN}$, are optimised for power division and phase distribution ($\theta_1$–$\theta_N$) and for matching. In the case of a 6-way combiner, the inputs enter the device at the ports 70 from the drains of the relevant FETs and the output is derived from terminal 74 via transmission line 75 and the parameters of the circuit are optimised for power combination and, as in the case of the divider, phase distribution and matching.

The ports 70 of the combiners/dividers in each divider/combiner unit have approximately equal phase-delay differences relative to each other. As already mentioned, these are shown as phase angles $\theta_1$–$\theta_6$, and the order of the phase delays in the combiners of a U1 unit is the reverse of the order of the phase delays in the divider of the same unit. The same applies mutatis mutandis to the U2 units.

A practical realisation of a 2N(N=6) divider/combiner is shown in FIG. 7. This is similar to the divider/combiner of FIG. 6, except that each node 80 is fed also by the further 6 ports 81 via their respective transmission lines 82. The circuit is symmetrical about the centre transmission line, i.e. the various $Z_N$, $\theta_N$ relating to ports P1–P6 are the same as the corresponding $Z_N$, $\theta_N$ relating to ports P7–P12.

The combining networks shown are optimized for power match of the FETs when they are used to feed an output (see, e.g., networks 100 and 101 in FIG. 5); input divider networks (e.g. network 102 in FIG. 5) are optimised for input match of the FETs and gain; an interstage network (e.g. any of combiners 103–107 in FIG. 5) is optimised for load match of the FETs and gain. The values of the Ls and Cs and of the Z, θ parameters of the transmission lines 71, 72 are required in the case of a divider to match the input impedance of the transistors, in the case of a combiner to match the output impedance of the transistors.

It is not necessary that the number of FETs in each cell of the various stages be the same. Thus, in the general case, the U1 unit 40 in FIG. 3 may have K FETs in each cell, the cells in the U1 units 41 and 42 may have L FETs, and those in the U2 units 43, 44 may have M FETs. K, L and M may all be different, or two of them may be the same. The case has already been described in which K, L and M are all the same. It is preferred, where K, L and M are different, that they be in ascending order—e.g. K=4, L=5, M=6.

Whereas in the preferred embodiment (FIGS. 3 and 5) the two U1 units 41 and 42 were merged at their inner interface (the N-way combiners) and likewise the two U2 units 43, 44 (at the N-way dividers) by the use of 2N combiners and dividers, respectively, it is possible to keep these respective pairs of units separate from each other. Such a scheme is shown in FIGS. 8 and 9 in two different forms. In FIG. 8 the inner N-way combiner 90 has its output tied directly to the input of the N-way divider 91, and there is a similar discrete link between the combiner 92 and the divider 93. In FIG. 9, on the other hand, the outputs of combiners 90 and 92 are tied together, as are the inputs of dividers 91 and 93, the thereby created common output 94 and common input 95 being connected together by a line 96.

While the FIG. 8 and FIG. 9 arrangements are possible, in practice they are not ideal, as they are wasteful of chip real-estate.

Figures 1A, 1B:
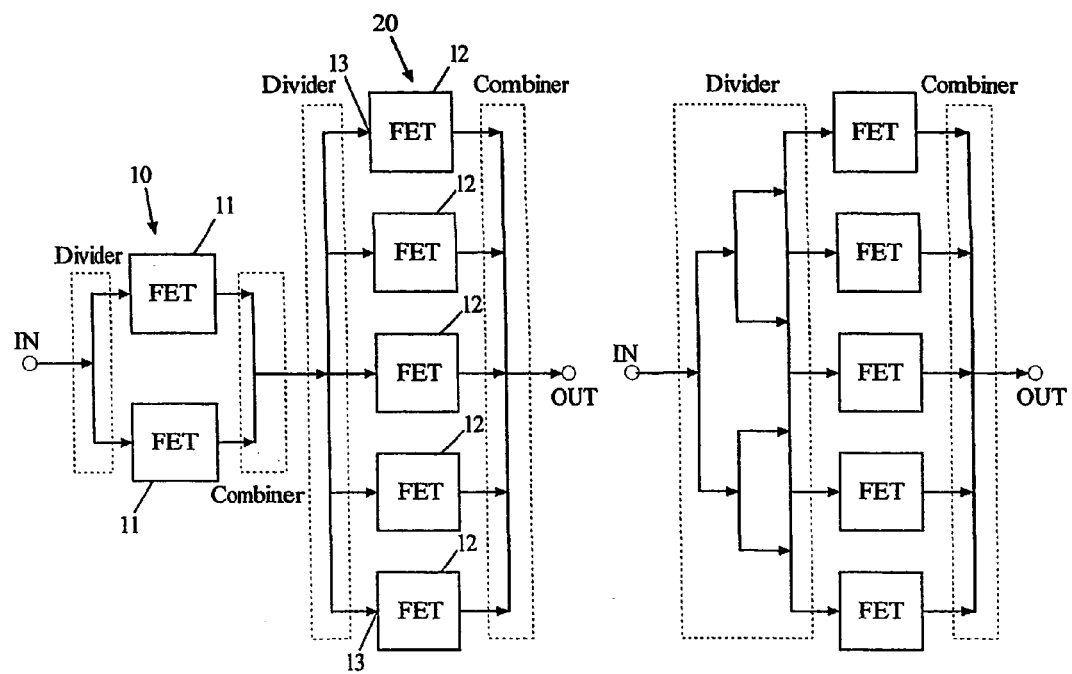
Figure 2:
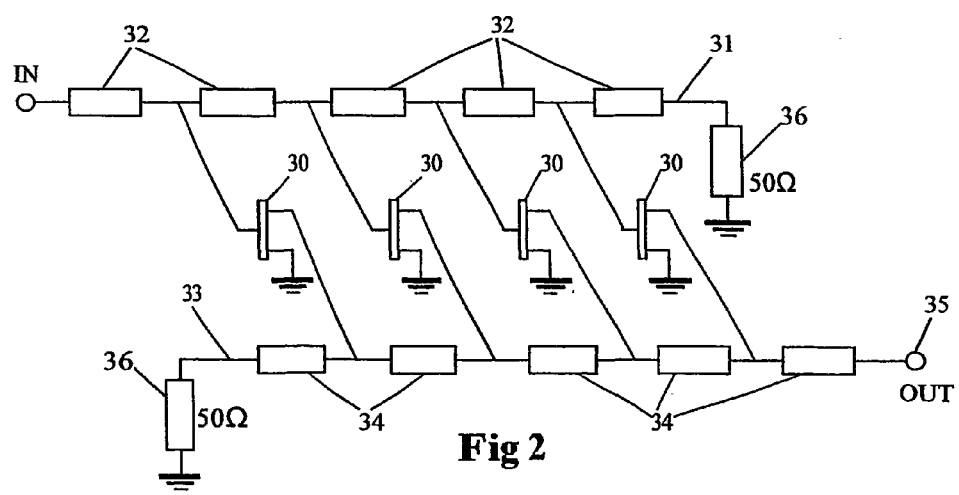
FIG. 2 is a circuit diagram of a known distributed amplifier arrangement.
Figure 4B:
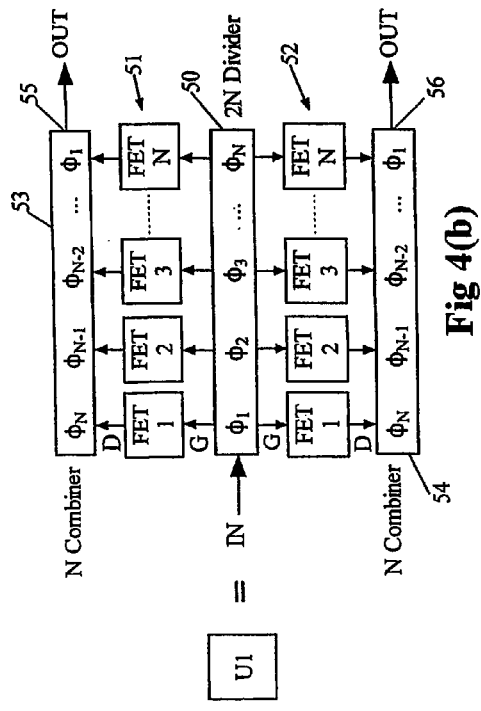
Figure 4C:
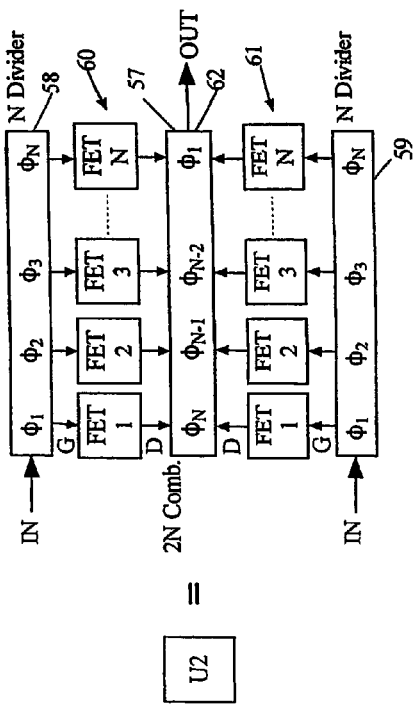

The realisations of the invention shown in FIGS. 5, 8 and 9, for example, yield an amplifier which occupies a chip substrate having an aspect ratio (ratio of length to width) which is of the order of 1.5:1 or even less. Actual designs have been produced by the inventors, in which the ratio was 1:1. This contrasts with prior schemes (e.g. the FIG. 1(b) arrangement), where the aspect ratio has been as much as 5:1. A near-unity aspect ratio produces a monolithic structure having intrinsically high rigidity, so that it can be handled without fear of becoming fractured.

The invention claimed is:

1. A multicell amplifier, comprising:
   a) a first power divider unit which, in use, receives an input signal of the amplifier, divides the input signal into 2N subsignals, amplifies the 2N subsignals into first amplified signals and recombines the first amplified signals in two N-way power combiners to form two local output signals;
   b) two further power divider units which, in use, take the two local output signals and divide the two local output signals into 4N subsignals, amplify the 4N subsignals into second amplified signals and recombine the second amplified signals to form three local output signals; and
   c) two power combiner units which, in use, take the three local output signals and divide the three local output signals into 4N subsignals, amplify the 4N subsignals into third amplified signals and recombine the third amplified signals to provide an output signal of the amplifier.

2. A multicell amplifier, comprising:
   a) a number of dividing units and combining units,
      i) each dividing unit comprising a 2N-way divider for dividing an input signal into first and second sets of N phase-shifted signals, a first cell of N amplifying devices and a second cell of N amplifying devices connected to receive the respective first and second phase-shifted signal sets and provide respective sets of amplified phase-shifted signals, and first and second N-way combiners connected to receive the respective sets of amplified phase-shifted signals, the N-way combiners having outputs forming first and second outputs of the respective dividing unit, each of the combiners introducing phase shifts which are the reverse of phase shifts introduced by the divider, and
      ii) each combining unit comprising first and second N-way dividers for dividing respective input signals into first and second sets of N phase-shifted signals, a first cell of N amplifying devices and a second cell of N amplifying devices connected to receive the respective first and second phase-shifted signal sets and provide respective sets of amplified phase-shifted signals, and a 2N-way combiner for combining the 2N amplified phase-shifted signals into an output signal of the combining unit, the combiner introducing phase shifts which are the reverse of phase shifts introduced by each divider;

b) a first dividing unit for receiving an input signal of the amplifier;
c) second and third dividing units connected to respective outputs of the first dividing unit;
d) a first combining unit having inputs connected to respective outputs of the second dividing unit;
e) a second combining unit having inputs connected to respective outputs of the third dividing unit; and
f) the first and second combining units having respective outputs combined to form an output of the amplifier.

3. The amplifier as claimed in claim 2, wherein an output of the second dividing unit and an output of the third dividing unit are combined to form a common output, and an input of the first combining unit and an input of the second combining unit are combined to form a common input, the common output being connected to the common input.

4. The amplifier as claimed in claim 3, wherein the common output is that of a 2N-way combiner providing a function of an N-way combiner in the second dividing unit and of an N-way combiner in the third dividing unit, and wherein the common input is that of a 2N-way divider providing a function of an N-way divider in the first combining unit and of an N-way divider in the second combining unit.

5. The amplifier as claimed in claim 4, wherein the number N in the first dividing unit corresponds to K cells, wherein the number N in the second and third dividing units corresponds to L cells, and wherein the number N in the first and second combining units corresponds to M cells.

6. The amplifier as claimed in claim 5, wherein K, L and M are all different and in ascending order.

7. The amplifier as claimed in claim 6, wherein the number N is the same in all units.

8. The amplifier as claimed in claim 2, wherein the amplifying devices are field effect transistors connected in common-source mode.

9. The amplifier as claimed in claim 2, wherein the amplifier is a monolithic amplifier on a substrate having an aspect ratio less than 1.5:1.

10. The amplifier as claimed in claim 2, wherein the phase-shifts in the various dividers and combiners are all approximately equal.

* * * * *

UNITED STATES PATENT AND TRADEMARK OFFICE
CERTIFICATE OF CORRECTION

| | | |
|---|---|---|
| PATENT NO. | : 7,239,215 B2 | Page 1 of 1 |
| APPLICATION NO. | : 10/482795 | |
| DATED | : July 3, 2007 | |
| INVENTOR(S) | : Hardial et al. | |

It is certified that error appears in the above-identified patent and that said Letters Patent is hereby corrected as shown below:

In Column 1, Line 26, delete "tacks" and insert -- tracks --, therefor.

In Column 1, Line 43, delete "product" and insert -- product, --, therefor.

Signed and Sealed this

Twenty-sixth Day of May, 2009

JOHN DOLL
*Acting Director of the United States Patent and Trademark Office*